(12) United States Patent
Van Abeelen et al.

(10) Patent No.: US 9,232,637 B2
(45) Date of Patent: Jan. 5, 2016

(54) KNITTED TEXTILE SUBSTRATE WITH DIFFERENT STITCH PATTERNS AND ELECTRONIC TEXTILE

(75) Inventors: Frank Anton Van Abeelen, Eindhoven (NL); Liesbeth Van Pieterson, Heeze (NL); Guofu Zhuo, Best (NL); Albericus Antonius Maria Hoevenaars, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 135 days.

(21) Appl. No.: 13/823,476

(22) PCT Filed: Sep. 15, 2011

(86) PCT No.: PCT/IB2011/054028
§ 371 (c)(1),
(2), (4) Date: Mar. 14, 2013

(87) PCT Pub. No.: WO2012/038862
PCT Pub. Date: Mar. 29, 2012

(65) Prior Publication Data
US 2013/0170158 A1    Jul. 4, 2013

(30) Foreign Application Priority Data
Sep. 22, 2010    (EP) .................................. 10178370

(51) Int. Cl.
*H05K 1/00* (2006.01)
*H05K 1/02* (2006.01)
*D04B 1/12* (2006.01)

(52) U.S. Cl.
CPC ............... *H05K 1/0283* (2013.01); *D04B 1/12* (2013.01); *D10B 2401/16* (2013.01); *D10B 2403/02431* (2013.01)

(58) Field of Classification Search
CPC ...... D04B 1/12; D10B 2401/16; H05K 1/0283
USPC .......... 174/250, 254, 256, 260; 361/760, 761, 361/765, 749–751; 66/173, 175, 176
See application file for complete search history.

(56) References Cited

U.S. PATENT DOCUMENTS 5,256,468 A * 10/1993 Wiener .......................... 428/193
6,493,933 B1    12/2002 Post et al.
(Continued)

FOREIGN PATENT DOCUMENTS

| EP | 1916323 A2 | 4/2008 |
| GB | 2462205 A | 2/2010 |

(Continued)

OTHER PUBLICATIONS

Thomas LOher et al; "Stretchable electronic Systems for wearable and textile Applications", Technische Universiuit Berlin, Fraunhofer Izm.
(Continued)

*Primary Examiner* — Yuriy Semenenko

(57) ABSTRACT

A knitted substrate (4; 16) for electrical connection of electronic components (3; 17a-f) thereto. The knitted substrate comprises a first set of substrate portions (5a-e; 9a-f) knitted with a first stitch pattern resulting in a first tensile stiffness; and a second set of substrate portions (6a-f; 18a-f) knitted with a second stitch pattern resulting in a second tensile stiffness that is greater than the first tensile stiffness. A substrate portion of the first set of substrate portions (5a-e; 19a-f) is provided between substrate portions (6a-f; 18a-f) of the second set of substrate portions, and each substrate portion of the second set of substrate portions (6a-f; 18a-f) comprises conductive yarns (11a-b) arranged to allow electrical connection of at least one of the electronic components (3; 17a-f) thereto.

8 Claims, 3 Drawing Sheets

(56) References Cited

U.S. PATENT DOCUMENTS

| | | |
|---|---|---|
| 7,595,452 B2 * | 9/2009 | Kirstein et al. ............... 174/250 |
| 7,683,643 B2 | 3/2010 | Qi et al. |
| 2004/0244193 A1 * | 12/2004 | Jung et al. ...................... 29/854 |
| 2005/0029680 A1 * | 2/2005 | Jung et al. ..................... 257/787 |
| 2006/0035554 A1 * | 2/2006 | Glaser et al. .................. 442/301 |
| 2006/0211934 A1 | 9/2006 | Hassonjee et al. |
| 2008/0091097 A1 | 4/2008 | Linti et al. |
| 2008/0143080 A1 * | 6/2008 | Burr .............................. 280/495 |

FOREIGN PATENT DOCUMENTS

| | | |
|---|---|---|
| WO | 0102052 A2 | 1/2001 |
| WO | 02084001 A1 | 10/2002 |
| WO | 2006063772 A1 | 6/2006 |

OTHER PUBLICATIONS

Vervust, Thomas "SWEET: Stretchable and Washable Electronics for Embedding in Textiles", Materials Research Society Symposium Proceedings, 2010.

* cited by examiner

KNITTED TEXTILE SUBSTRATE WITH DIFFERENT STITCH PATTERNS AND ELECTRONIC TEXTILE

FIELD OF THE INVENTION

The present invention relates to a textile substrate for an electronic textile, and to an electronic textile comprising such a textile substrate.

BACKGROUND OF THE INVENTION

Many types of textiles are used in our every-day life. When electronics are unobtrusively integrated into these textiles to create electronic textiles, new application fields emerge. One such example of a new application is light-emitting textiles, and other examples include textile-based sensing systems, wearable electronics etc.

For some of these new applications, such as for electronic textiles intended to be applied around moving body parts of a user, the stretchability of the electronic textile is important.

Currently proposed electronic textiles are drapable, i.e. they can be draped around a shape. However, electronic textiles with a high stretchability remain to be developed.

SUMMARY OF THE INVENTION

In view of the above-mentioned and other drawbacks of the prior art, a general object of the present invention is to enable the manufacture of stretchable electronic textiles.

According to the present invention there is provided a knitted substrate for electrical connection of electronic components thereto, comprising: a first set of substrate portions knitted with a first stitch pattern resulting in a first tensile stiffness; and a second set of substrate portions knitted with a second stitch pattern resulting in a second tensile stiffness higher than the first tensile stiffness, wherein a substrate portion of the first set of substrate portions is provided between substrate portions of the second set of substrate portions, and each substrate portion of the second set of substrate portions comprises conductive yarns arranged to allow electrical connection of at least one of the electronic components thereto.

By "tensile stiffness" should, in the context of the present application, be understood stiffness in at least one direction in the plane defined by the knitted textile substrate. The tensile stiffness may be represented by a Young's modulus.

"Yarns" may comprise one or several fibers, and, in particular, the conductive yarns may comprise a plurality of conductive strands, which may, for example, be twisted, braided or woven.

As was stated in the Background section above, it is, for some applications, highly desirable to provide for a stretchable electronic textile. However, stretching the electronic textile is expected to result in excessive stress on the electronic components comprised in the electronic textile and/or the electrical connections between the electronic components and the conductor pattern of the stretchable substrate on which the electronic components are mounted, which would be likely to lead to a too low reliability of such an electronic textile.

The present invention is based on the realization that the desired stretchability can be combined with a satisfactory reliability by providing a textile substrate with relatively stiff portions for component mounting and relatively stretchable portions provided between the stiff portions. The present inventors have further realized that such relatively stiff portions and relatively stretchable portion(s) can conveniently be achieved by providing a knitted substrate with different stitch patterns in component mounting locations and in portions of the substrate between component mounting locations.

Substrate portions of the second set of substrate portions may advantageously be knitted from the conductive yarns and non-conductive yarns.

Furthermore, the substrate portion of the first set of substrate portions being provided between substrate portions of the second set of substrate portions may be rib-knitted. Through the rib-knitting, high stretchability can conveniently be achieved.

Moreover, at least one of the substrate portions of the second set of substrate portions may be knitted in a stockinette pattern, which results in a knit with a relatively low stretchability (depending on the direction of strain).

According to one embodiment, substrate portions of the first set of substrate portions and substrate portions of the second set of substrate portions may be arranged in alternating stripes. This embodiment allows for easy manufacturing and may be particularly suitable for applications where tensile strain is expected to mainly occur along a known predominant direction of tensile strain. When the knitted substrate is in use, the alternating stripes may advantageously be arranged to extend substantially perpendicularly to this predominant direction of tensile strain.

According to another embodiment, substrate portions of the second set of substrate portions may be arranged as islands, each being substantially surrounded by an associated substrate portion of the first set of substrate portions. The knitted substrate according to this embodiment may be particularly advantageous for applications in which strain is expected to occur in several directions at the same time, or in which the main direction of tensile strain is unknown or expected to vary over time or between devices including the knitted substrate.

The knitted substrate according to various embodiments of the present invention may, furthermore, advantageously be comprised in an electronic textile further comprising a plurality of electronic components, each being attached to a substrate portion of the second set of substrate portions comprised in the knitted substrate in such a way that the electronic component is electrically connected to at least one conductive yarn.

BRIEF DESCRIPTION OF THE DRAWINGS

These and other aspects of the present invention will now be described in more detail, with reference to the appended drawings showing example embodiments of the invention, wherein.

DETAILED DESCRIPTION OF THE EMBODIMENTS

In the following description, the present invention is described with reference to an electronic textile in the form of a light-emitting stretchable band for light-treatment of a body part of a user. This electronic textile is based on a knitted substrate with substrate portions with different stiffness arranged in alternating stripes. Substrate portions with relatively high stiffness are formed through a so-called stockinette stitch pattern, and substrate portions with relatively low stiffness are formed through rib stitching.

It should be noted that this by no means limits the scope of the invention, which is equally applicable to other knitted substrates having a first set of substrate portions knitted with a first stitch pattern resulting in a first stiffness and a second set of substrate portions with a second stitch pattern resulting in a second stiffness that is greater than the first stiffness. For example, the stitch patterns need not be arranged in alternating stripes, but may be arranged in any configuration as long as a substrate portion of the first set of substrate portions (with a relatively low stiffness) is provided between substrate portions of the second set of substrate portions (with a relatively high stiffness). Furthermore, there are many different kinds of stitch patterns that could be used to create the different substrate portions, and it will be straight-forward to those skilled in the art to verify the (tensile) stiffness of different stitch patterns.

Figure 1:
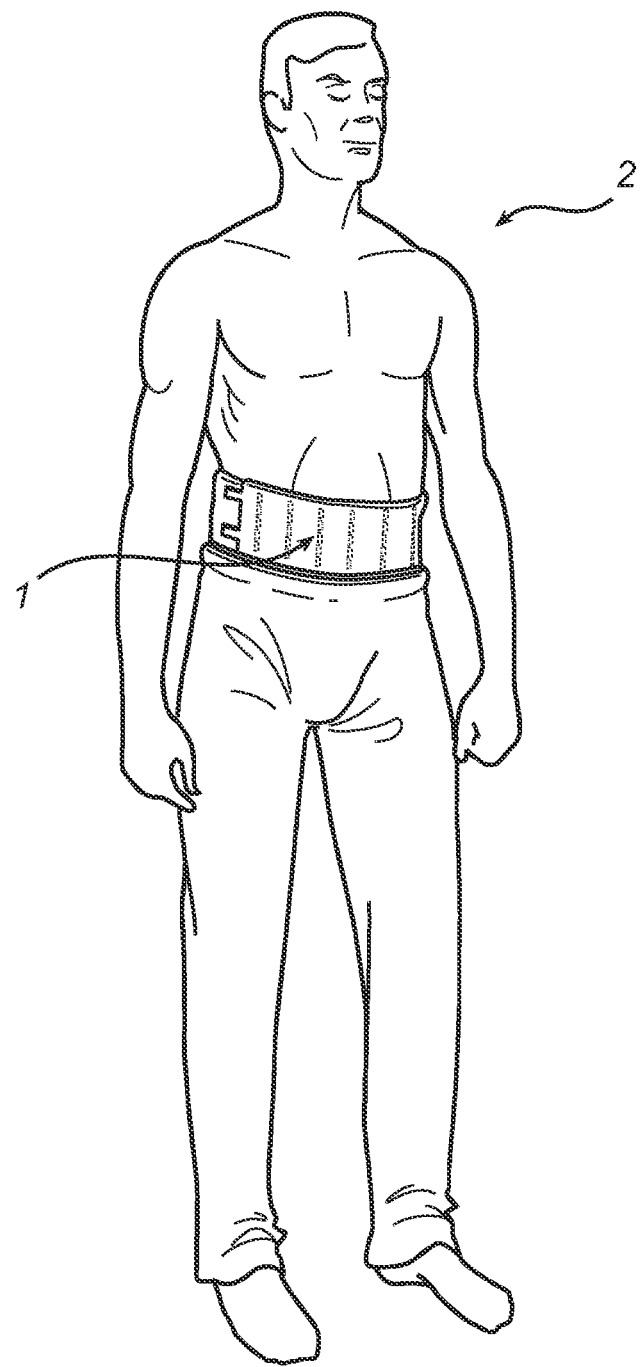
FIG. 1 is a schematic illustration of an exemplary application for an electronic textile comprising a first embodiment of the knitted substrate according to the present invention.

FIG. 1 is a schematic illustration of an exemplary application for an electronic textile comprising a first embodiment of the knitted substrate according to the present invention, in the form of a light-emitting stretchable band 1 for light-treatment of a body part of a user 2. Another typical example is a band around a joint like an elbow or knee (with local stretch up to 40%).

Figure 2:
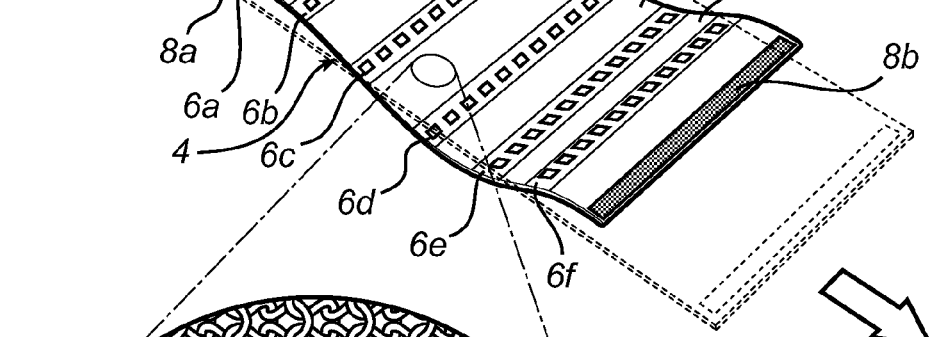
FIG. 2 schematically illustrates the electronic textile in FIG. 1.

In FIG. 2, the light-emitting stretchable band 1 in FIG. 1 is shown in greater detail. As can be seen in FIG. 2, the light-emitting stretchable band 1 comprises a plurality of electronic components, here in the form of light-emitting diodes (LEDs) 3 (for the sake of clarity of drawing, only one of the LEDs is indicated by a reference numeral) arranged on a knitted textile substrate 4. The knitted textile substrate comprises a first set of substrate portions 5a-e knitted in a first stitch pattern, and a second set of substrate portions 6a-f knitted in a second stitch pattern. The first and second stitch patterns are selected such that the tensile stiffness (Young's modulus $E_2$) of the substrate portions 6a-f of the second set of substrate portions is greater than the tensile stiffness (Young's modulus $E_1$) of the substrate portions 5a-e of the first set of substrate portions.

As can be seen in FIG. 2, the LEDs 3 are attached to the substrate portions 6a-f of the second set of substrate portions. Although it cannot be seen in FIG. 2, the knitted textile substrate 4 is made of non-conductive yarns and conductive yarns, and the LEDs 3 are electrically connected to conductive yarns. This will be described further below with reference to FIG. 3, which is an enlarged view of one 6b of the substrate portions of the second set of substrate portions.

With continued reference to FIG. 2, the light-emitting stretchable band 1 further comprises fastening portions 8a-b for attaching the light-emitting stretchable band 1 to a selected body part. The fastening portions 8a-b may, for example be of the hook-and-loop type, snap buttons or similar. The light-emitting stretchable band 1 additionally comprises a power source (not shown) such as one or several batteries. Although not shown in FIG. 1, a phototherapy device like that in FIG. 1 may have additional layers, such as a spacer layer for keeping a minimum distance between the LEDs and the skin of the user, and a skin compatible top layer.

When the light-emitting stretchable band 1 is attached to the selected body part, for example as is indicated in FIG. 1, the light-emitting stretchable band 1 is stretched such that the fastening portions 8a-b can engage with each other and hold the light-emitting stretchable band 1 in place. When the light-emitting stretchable band 1 is stretched in this manner, the knitted textile substrate 4 will stretch and become elongated as is schematically indicated by the arrows in FIG. 2. The substrate portions 5a-e of the first set of substrate portions will easily stretch, while the substrate portions 6a-f of the second set of substrate portions, which have a higher tensile stiffness than the substrate portions 5a-e of the first set of substrate portions, will absorb stress without much elongation. This reduces the stress on the LEDs 3 and on the electrical (and mechanical) connections between pads of the LEDs 3 and the conductor pattern of the knitted textile substrate 4, which in turn reduces the risk of malfunction of the electronic textile. If the LEDs 3 were instead attached to a substrate with a uniform (and high) stretchability along its entire length, much of the stress would be absorbed by the relatively stiff LEDs 3 and their connections to the substrate.

One exemplary configuration of the knitted textile substrate 4 will now be described with reference to FIGS. 3 and 4.

Figure 3:
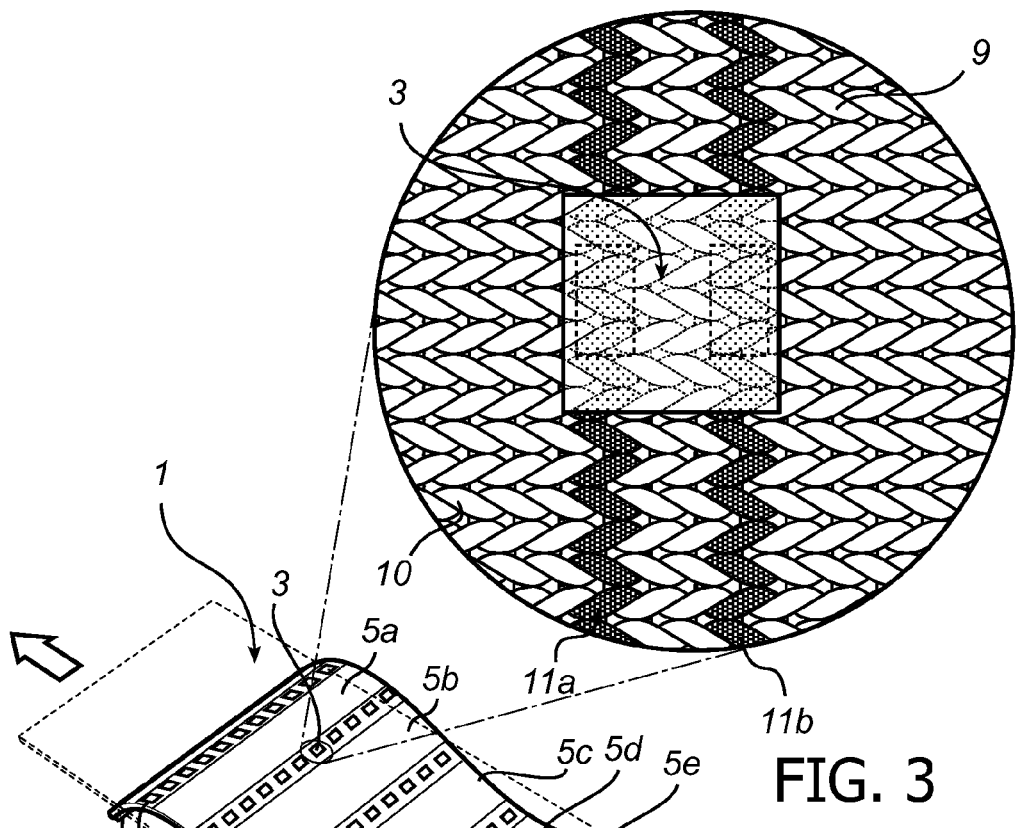
FIG. 3 is an enlarged view of a first portion of the electronic textile in FIG. 2, where the knitted substrate has a stitch pattern with a relatively high stiffness.

FIG. 3 is an enlarged view of a substrate portion 6b of the second set of substrate portions. As is schematically indicated in FIG. 3, the substrate portion 6b is knitted using a so-called stockinette stitch pattern with knit stitches 9 only (as seen from the side visible in FIG. 3). The substrate portion 6b comprises non-conductive yarns 10 and conductive yarns 11a-b. The conductive yarns 11a-b define a conductor pattern to which the LED 3 in FIG. 3 is connected. The LED 3 can be electrically connected to the conductive yarns 11a-b in any suitable manner, such as through soldering or using conductive glue, etc.

Figure 4:
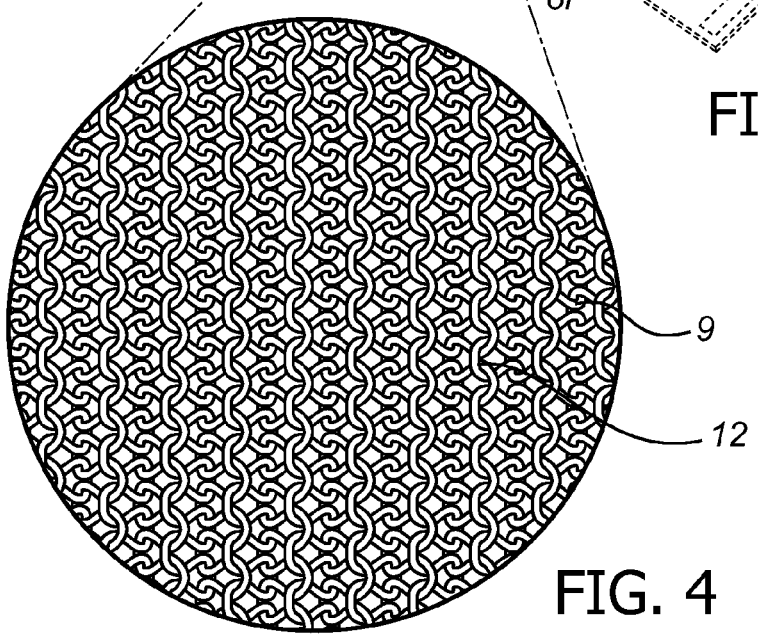
FIG. 4 is an enlarged view of a second portion of the electronic textile in FIG. 2, where the knitted substrate has a stitch pattern with a relatively low stiffness.

FIG. 4 is an enlarged view of a substrate portion 5c of the first set of substrate portions. As is schematically indicated in FIG. 4, the substrate portion 5c is knitted using a so-called 1×1 rib knitting with a periodic pattern of one row of knit stitches 9 and one row of purl stitches 12. Through the rib stitching, the substrate portion 5c shown in FIG. 4 will have a considerably lower tensile stiffness (lower Young's modulus $E_1$) than the substrate portion 6b shown in FIG. 3, at least in the row direction (the direction indicated by the arrows in FIG. 2).

Although the configuration shown in FIG. 2 with substrate portions 5a-e from the first set of substrate portions and substrate portions 6a-f from the second set of substrate portions arranged in alternating strips is adequate for applications such as that shown in FIG. 1, there may be other applications where the main direction of tensile strain is not known, or may vary over time. For such applications, an electronic textile may advantageously be based on a knitted textile substrate having another configuration of the substrate portions of the first set of substrate portions and the substrate portions of the second set of substrate portions.

Figure 5:
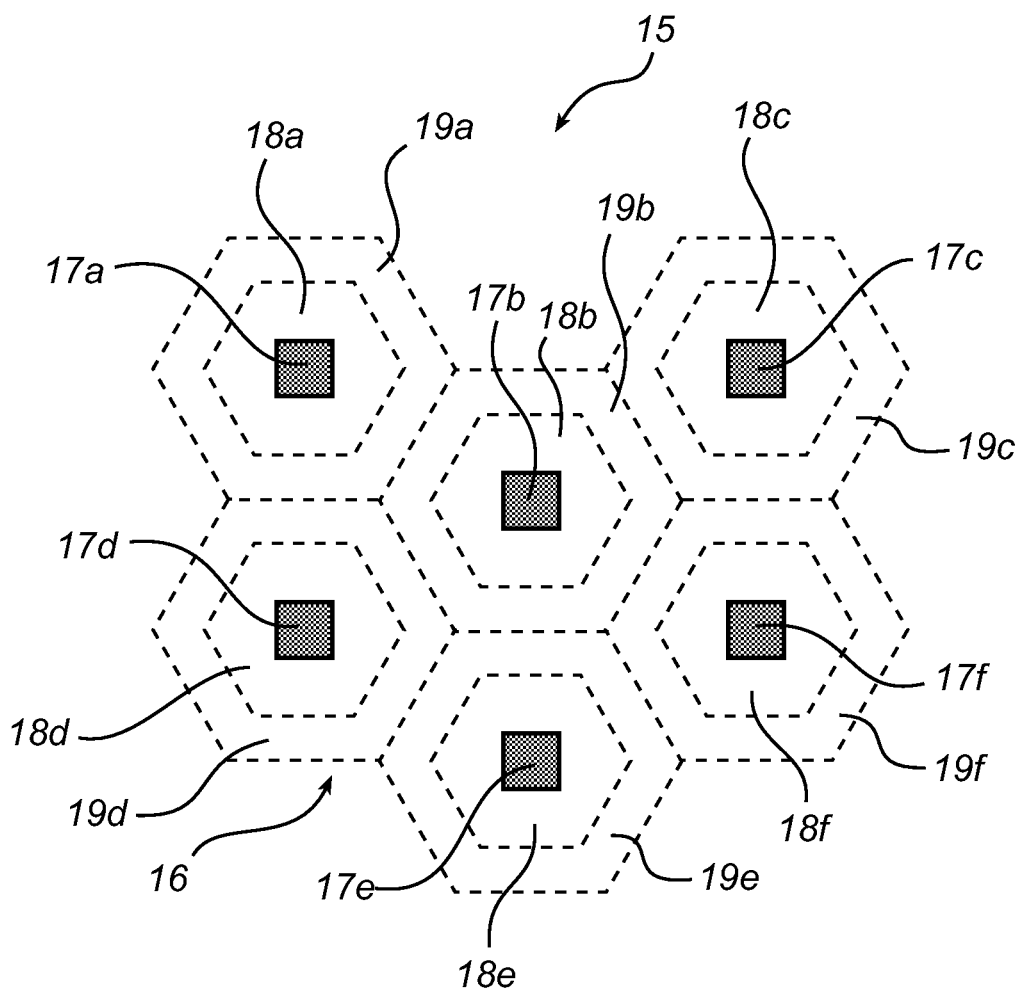
FIG. 5 schematically illustrates an electronic textile comprising a second embodiment of the knitted substrate according to the present invention.

FIG. 5 schematically illustrates an electronic textile 15 comprising a knitted textile substrate 16 according to a second embodiment of the present invention and a plurality of electronic components 17a-f attached to the knitted textile substrate 16. As is schematically indicated in FIG. 5, the knitted textile substrate 16 comprises substrate portions 18a-f made of a stitch pattern resulting in a relatively high tensile stiffness (high Young's modulus $E_2$). Each of these substrate portions 18a-f is surrounded by substrate portions 19a-f made of a stitch pattern resulting in a relatively low tensile stiffness (low Young's modulus $E_1$).

Additionally, variations to the disclosed embodiments can be understood and effected by the skilled person in practicing the claimed invention, from a study of the drawings, the disclosure, and the appended claims. For example, many other types of stitch patterns can be used. It will be straightforward to those skilled in the art to determine which stitch patterns result in high or low tensile stiffness (high or low Young's modulus).

In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage.

The invention claimed is:

1. A knitted substrate for electrical connection of electronic components thereto, comprising:
    conductive yarns and non-conductive yarns;
    a first set of substrate portions knitted with a first stitch pattern of said non-conductive yarns, resulting in a first tensile stiffness; and
    a second set of substrate portions knitted with a second stitch pattern of said non-conductive yarns, resulting in a second tensile stiffness that is greater than said first tensile stiffness,
    wherein a member of said first set of substrate portions is provided between members of said second set of substrate portions, and
    wherein each member of said second set of substrate portions comprises conductive yarns arranged to allow electrical connection of at least one of said electronic components thereto.

2. The knitted substrate according to claim 1, wherein said members of said second set of substrate portions are knitted from said conductive yarns and non-conductive yarns.

3. The knitted substrate according to claim 1, wherein said member of said first set of substrate portions being provided between members of said second set of substrate portions is rib-knitted.

4. The knitted substrate according to claim 1, wherein at least one of said members of said second set of substrate portions is knitted in a stockinette pattern.

5. The knitted substrate according to claim 1, wherein said members of said first set of substrate portions and members of said second set of substrate portions are arranged in alternating stripes.

6. The knitted substrate according to claim 1, wherein said members of said second set of substrate portions are arranged as islands, each being substantially surrounded by an associated member of said first set of substrate portions.

7. An electronic textile comprising:
    the knitted substrate according to claim 1; and
    a plurality of electronic components, each being attached to a member of said second set of substrate portions comprised in the knitted substrate in such a way that said electronic component is electrically connected to at least one conductive yarn.

8. The knitted substrate according to claim 1,
    wherein said first set of substrate portions does not share a common member with said second set of substrate portions.

* * * * *